US012701945B2

(12) United States Patent
Jang et al.

(10) Patent No.: US 12,701,945 B2
(45) Date of Patent: Aug. 4, 2026

(54) SUBSTRATE PROCESSING APPARATUS AND METHOD OF CONTROLLING THE SAME

(71) Applicant: SEMES CO., LTD., Cheonan-si (KR)

(72) Inventors: Joonhwan Jang, Cheonan-si (KR);
Soonkab Kwon, Gimhae-si (KR);
Hyoju Lee, Pohang-si (KR)

(73) Assignee: SEMES CO., LTD., Cheonan-si (KR)

( * ) Notice: Subject to any disclaimer, the term of this patent is extended or adjusted under 35 U.S.C. 154(b) by 101 days.

(21) Appl. No.: 18/394,068

(22) Filed: Dec. 22, 2023

(65) Prior Publication Data

US 2024/0222153 A1 Jul. 4, 2024

(30) Foreign Application Priority Data

Dec. 29, 2022 (KR) ......................... 10-2022-0189738

(51) Int. Cl.
H10P 72/00 (2026.01)
H10P 72/30 (2026.01)

(52) U.S. Cl.
CPC ...... H10P 72/0406 (2026.01); H10P 72/0434 (2026.01); H10P 72/33 (2026.01)

(58) Field of Classification Search
CPC ......... H01L 21/67028; H01L 21/67109; H01L 21/67739
USPC ......................................................... 34/549
See application file for complete search history.

(56) References Cited

U.S. PATENT DOCUMENTS

| | | | | |
|---|---|---|---|---|
| 5,551,165 A | * | 9/1996 | Turner .............. | H01L 21/67028 34/92 |
| 5,671,544 A | * | 9/1997 | Yokomizo ......... | H01L 21/67034 34/169 |
| 6,143,040 A | * | 11/2000 | Tometsuka .............. | C23C 14/56 414/217 |
| 7,020,981 B2 | * | 4/2006 | Shero ................ | C23C 16/45548 438/785 |
| 8,190,281 B2 | * | 5/2012 | Yokouchi ......... | G05B 19/41865 700/177 |

(Continued)

FOREIGN PATENT DOCUMENTS

| | | | | |
|---|---|---|---|---|
| CN | 118280878 A | * | 7/2024 | ............... B08B 3/08 |
| JP | 06-241486 | | 8/1994 | |

(Continued)

OTHER PUBLICATIONS

Office Action from the Korean Intellectual Property Office dated Apr. 23, 2024.

*Primary Examiner* — Stephen M Gravini

(57) ABSTRACT

Provided is a substrate processing apparatus including a substrate processing unit including a support member configured to support a substrate, an entrance on one side of the substrate processing unit configured to allow the substrate to enter and exit the substrate processing unit, and a housing configured to accommodate the substrate, and a first blowing member configured to supply air, wherein the first blowing member includes a fan housing with an open top and an open bottom, a fan arranged inside the fan housing and configured to flow air from the open top to the open bottom of the fan housing, a pair of first heaters arranged spaced apart from each other in a first horizontal direction with the fan therebetween and configured to supply heat.

20 Claims, 14 Drawing Sheets

(56) References Cited

U.S. PATENT DOCUMENTS

| | | | | |
|---|---|---|---|---|
| 8,985,929 B2 * | 3/2015 | Enokida | ............ | H01L 21/67178 |
| | | | | 414/217 |
| 9,349,620 B2 * | 5/2016 | Kamata | ............. | H01L 21/67109 |
| 10,477,695 B2 * | 11/2019 | Utsumi | ................. | F26B 21/004 |
| 11,328,925 B2 * | 5/2022 | Sasaki | .............. | H01L 21/68728 |
| 2022/0319905 A1 * | 10/2022 | Song | ......................... | B05C 9/14 |
| 2023/0205100 A1 * | 6/2023 | Son | ..................... | H01L 21/6708 |
| | | | | 355/30 |
| 2024/0222153 A1 * | 7/2024 | Jang | .................. | H01L 21/67109 |
| 2025/0201615 A1 * | 6/2025 | Kong | ................ | H01L 21/67103 |

FOREIGN PATENT DOCUMENTS

| | | | | | |
|---|---|---|---|---|---|
| JP | 2008-235302 | | 10/2008 | | |
| KR | 10-2009-0032656 | | 4/2009 | | |
| KR | 10-2009-0065758 | | 6/2009 | | |
| KR | 20130032272 A | * | 4/2013 | ....... | H01L 21/67178 |
| KR | 10-1988457 | | 6/2019 | | |
| KR | 10-2020-0102245 | | 8/2020 | | |
| KR | 10-2160436 | | 9/2020 | | |
| KR | 10-2021-0036084 | | 4/2021 | | |
| KR | 102776612 B1 | * | 3/2025 | ....... | H01L 21/67739 |
| TW | I600106 B | * | 9/2017 | ....... | H01L 21/67745 |

* cited by examiner

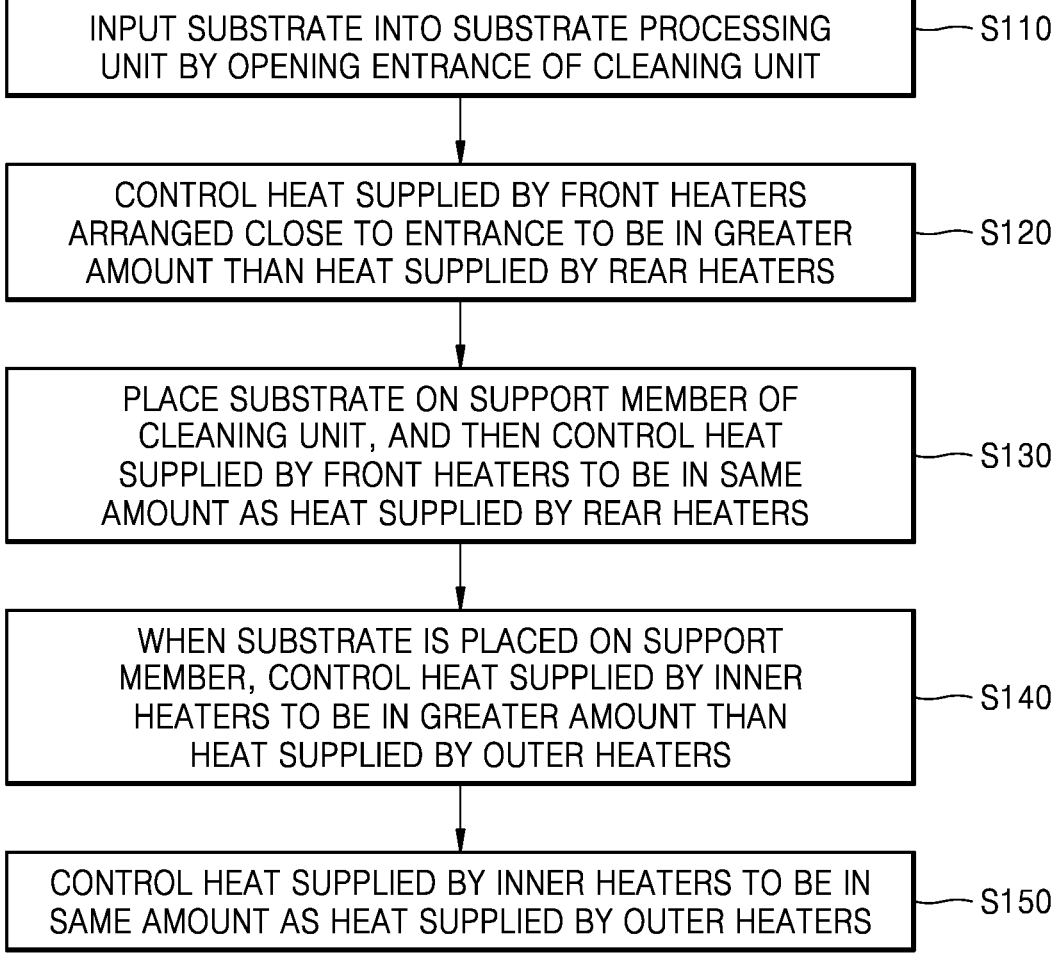

INPUT SUBSTRATE INTO SUBSTRATE PROCESSING UNIT BY OPENING ENTRANCE OF CLEANING UNIT — S110

CONTROL HEAT SUPPLIED BY FRONT HEATERS ARRANGED CLOSE TO ENTRANCE TO BE IN GREATER AMOUNT THAN HEAT SUPPLIED BY REAR HEATERS — S120

PLACE SUBSTRATE ON SUPPORT MEMBER OF CLEANING UNIT, AND THEN CONTROL HEAT SUPPLIED BY FRONT HEATERS TO BE IN SAME AMOUNT AS HEAT SUPPLIED BY REAR HEATERS — S130

WHEN SUBSTRATE IS PLACED ON SUPPORT MEMBER, CONTROL HEAT SUPPLIED BY INNER HEATERS TO BE IN GREATER AMOUNT THAN HEAT SUPPLIED BY OUTER HEATERS — S140

CONTROL HEAT SUPPLIED BY INNER HEATERS TO BE IN SAME AMOUNT AS HEAT SUPPLIED BY OUTER HEATERS — S150

SUBSTRATE PROCESSING APPARATUS AND METHOD OF CONTROLLING THE SAME

CROSS-REFERENCE TO RELATED APPLICATION

This application is based on and claims priority under 35 U.S.C. § 119 to Korean Patent Application No. 10-2022-0189738, filed on Dec. 29, 2022, in the Korean Intellectual Property Office, the disclosure of which is incorporated by reference herein in its entirety.

BACKGROUND

1. Field

The disclosure relates to a substrate processing apparatus, and more particularly, to a substrate cleaning apparatus.

2. Description of the Related Art

In general, as the miniaturization of circuit patterns has rapidly progressed with advances in the density, integration, and performance of semiconductor devices, contaminants on the surface of a substrate, such as particles, organic contaminants, or metal contaminants, have a significantly negative effect on the characteristics and production yield of semiconductor devices. For this reason, a cleaning process of removing various contaminants attached to the surface of a substrate has become significantly important in a semiconductor manufacturing process, and a process of cleaning a substrate is performed at stages before and after each unit process for manufacturing a semiconductor.

Currently, the cleaning methods used in semiconductor manufacturing processes are classified into dry cleaning and wet cleaning. Wet cleaning is classified into bath-type methods of immersing a substrate in a chemical liquid to remove contaminants by chemical dissolution and a spin-type method of supplying a chemical liquid to the surface of a substrate while placing the substrate on a spin chuck to rotate the substrate, to remove contaminants.

In the spin-type methods, the process is performed in a cleaning chamber in which the spin chuck is installed, and during the process, clean air flows from the top to the bottom by a fan filter unit installed on the top of the cleaning chamber while forming a downward air flow, and the clean air is exhausted through an exhaust member (not shown). As the clean air is supplied, the pressure inside the cleaning chamber is maintained to be greater than the pressure outside of the chamber, which is equal to the atmospheric pressure, by several pascals.

SUMMARY

Provided is a substrate processing apparatus including a heater inside a fan filter unit, thereby being capable of supplying low-humidity clean air into a cleaning unit.

The objects of the disclosure is not limited thereto, and other objects not mentioned above will be clearly understood by those skill in the art from the following description.

Additional aspects will be set forth in part in the description which follows and, in part, will be apparent from the description, or may be learned by practice of the presented embodiments of the disclosure.

According to an aspect of the disclosure, a substrate processing apparatus includes a substrate processing unit including a support member configured to support a substrate, an entrance on one side of the substrate processing unit and configured to allow the substrate to enter and exit the substrate processing unit, and a housing configured to accommodate the substrate, and a first blowing member configured to supply air by forming a downward air flow toward the substrate processing unit, wherein the first blowing member includes a fan housing with an open top and an open bottom, a fan arranged inside the fan housing and configured to flow air from the open top to the open bottom of the fan housing, a pair of first heaters arranged spaced apart from each other in a first horizontal direction with the fan therebetween and configured to supply heat, and a pair of second heaters arranged spaced apart from each other in a second horizontal direction perpendicular to the first horizontal direction with the fan therebetween and configured to supply heat, and the substrate processing apparatus further includes a controller configured to control heat supply by the pair of first heaters and the pair of second heaters.

According to an embodiment, the pair of first heaters include an external heater arranged close to the housing of the substrate processing unit, and an inner heater facing the outer heater with the fan therebetween, and the inner heater vertically overlaps a portion of the substrate accommodated in the substrate processing unit.

According to an embodiment, the controller is further configured to, in a case in which the substrate is supported by the support member, control heat supplied by the inner heater to be in a greater amount than heat supplied by the outer heater.

According to an embodiment, the pair of second heaters include a front heater arranged close to the entrance of the substrate processing unit, and a rear heater facing the front heater with the fan therebetween.

According to an embodiment, the controller is further configured to, in a case in which the entrance of the substrate processing unit is opened, control heat supplied by the front heater to be in a greater amount than heat supplied by the rear heater.

According to an embodiment, each of the pair of first heaters has a first width in the first horizontal direction, and the fan housing has a second width less than the first width, in the first horizontal direction.

According to an embodiment, the substrate processing apparatus further includes a second blowing member arranged in contact with the first blowing member in the first horizontal direction, and the second blowing member is configured to supply air by forming a downward air flow toward the substrate processing unit.

According to an embodiment, the fan vertically overlaps a portion of the substrate accommodated in the substrate processing unit.

According to an embodiment, the first blowing member further includes a blocking member configured to block a flow of air flowing backward to the first blowing member, and the blocking member is further configured to block a flow of air flowing backward into a clearance space between the fan housing and the fan.

According to an embodiment, the blocking member is provided as an annular plate corresponding to the clearance space between the fan housing and the fan.

According to another aspect of the disclosure, a substrate processing apparatus includes a substrate processing unit including a support member configured to support a substrate, an entrance on one side of the substrate processing unit and configured to allow the substrate to enter and exit the substrate processing unit, and a housing configured to accommodate the substrate, and a first blowing member configured to supply air by forming a downward air flow toward the substrate processing unit, wherein the first blowing member includes a fan housing with an open top and an open bottom, a fan arranged inside the fan housing and configured to flow air from the open top to the open bottom of the fan housing, and a plurality of heaters arranged around the fan in an annular shape and configured to supply heat, and the substrate processing apparatus further includes a controller configured to control heat supply by the plurality of heaters.

According to an embodiment, the plurality of heaters include an external heater arranged closest to the housing of the substrate processing unit, and an inner heater facing the outer heater with the fan therebetween, and the inner heater vertically overlaps the substrate accommodated in the substrate processing unit.

According to an embodiment, the controller is further configured to, in a case in which the substrate is supported by the support member, control heat supplied by the inner heater to be in a greater amount than heat supplied by the outer heater.

According to an embodiment, the plurality of heaters include a front heater arranged closest to the entrance of the substrate processing unit, and a rear heater facing the front heater with the fan therebetween.

According to an embodiment, the controller is further configured to, in a case in which the entrance of the substrate processing unit is opened, control heat supplied by the front heater to be in a greater amount than heat supplied by the rear heater.

According to an embodiment, the substrate processing apparatus further includes a second blowing member arranged in contact with the first blowing member in the first horizontal direction, and the second blowing member is configured to supply air by forming a downward air flow toward the substrate processing unit.

According to an embodiment, each of the plurality of heaters has a cylindrical shape having a first width in a second horizontal direction, and the fan housing has a second width greater than the first width in a first horizontal direction perpendicular to the second horizontal direction.

According to an embodiment, the fan vertically overlaps a portion of the substrate accommodated in the substrate processing unit.

According to another aspect of the disclosure, a method of controlling a substrate processing apparatus includes placing a substrate into a substrate processing unit by opening an entrance of the substrate processing unit, controlling heat supplied by a front heater arranged close to the entrance to be in a greater amount than heat supplied by a rear heater arranged farther from the entrance than the front heater, placing the substrate on a support member inside the substrate processing unit, and then controlling the heat supplied by the front heater to be in the same amount as the heat supplied by the rear heater, and controlling heat supplied by an inner heater arranged close to the support member to be in a greater amount than heat supplied by an outer heater arranged farther from the support member than the inner heater.

According to an embodiment, the method of controlling the substrate processing apparatus further includes separating the substrate from the support member and then controlling the heat supplied by the inner heater to be in the same amount as the heat supplied by the outer heater.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 12 is a plan view of a substrate processing apparatus according to another embodiment;

FIG. 14 is a flowchart illustrating a method of controlling a substrate processing apparatus according to an embodiment.

DETAILED DESCRIPTION

Figure 1:
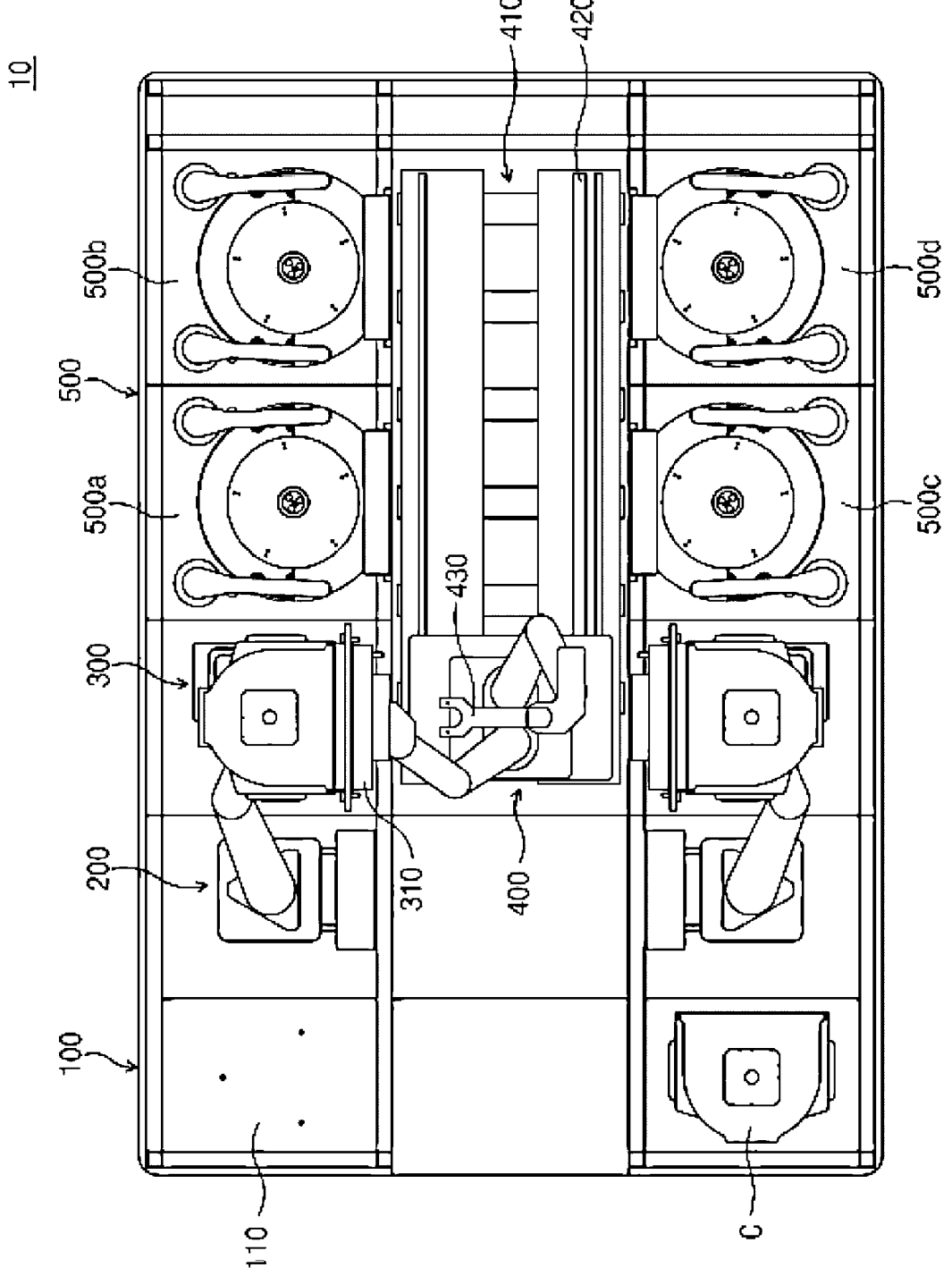
FIG. 1 is a plan view illustrating a configuration of a substrate processing system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, embodiments will be described in detail with reference to the accompanying drawings. However, the disclosure should not be configured as limited to the embodiments described below, and may be embodied in various other forms. The following embodiments are provided to sufficiently convey the scope of the disclosure to those skill in the art rather than to make the disclosure to be wholly completed.

Figure 2:
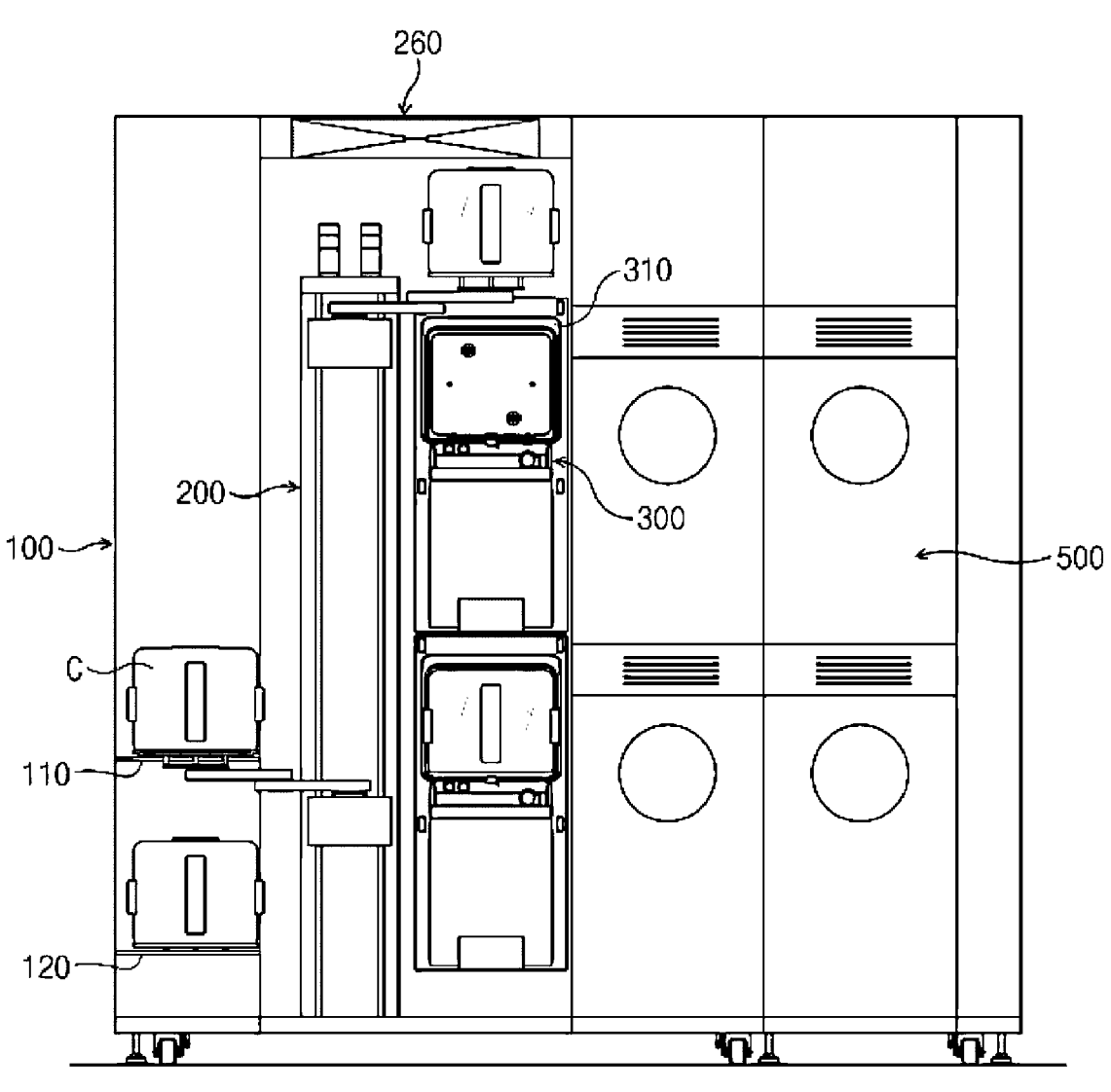
FIG. 2 is a side view illustrating a configuration of a substrate processing system according to an embodiment.

FIG. 1 is a plan view illustrating a configuration of a substrate processing system according to an embodiment, and FIG. 2 is a side view illustrating a configuration of a substrate processing system according to an embodiment. In addition, FIG. 3 is a diagram illustrating chambers in a multi-layer structure in a substrate processing system according to an embodiment.

Figure 3:
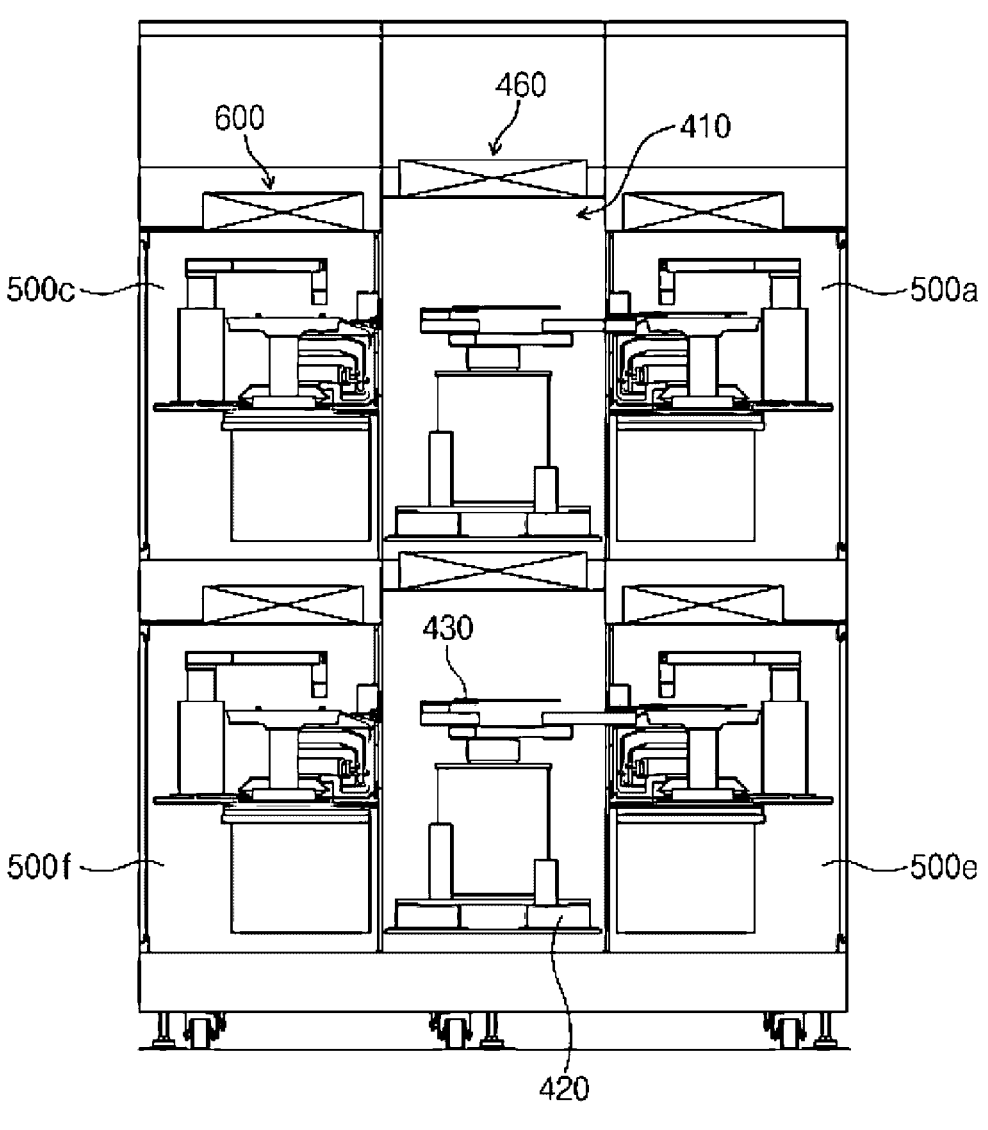
FIG. 3 is a diagram illustrating chambers in a multi-layer structure in a substrate processing system according to an embodiment.

Referring to FIGS. 1 to 3, a substrate processing system 10 according to the disclosure includes a loading/unloading unit 100, a carrier transfer unit 200, a carrier table 300, a substrate transfer unit 400, and a substrate processing unit 500. The substrate processing unit 500 to be described below may be a cleaning unit configured to perform a cleaning process on a substrate.

A carrier C accommodating substrates is placed on the loading/unloading unit 100. The carrier transfer unit 200 is arranged adjacent to the loading/unloading unit 100, and the substrate transfer unit 400 is arranged at the center of the other side of the carrier transfer unit 200. The substrate transfer unit 400 has a passage 410 formed in a direction perpendicular to the carrier transfer unit 200 and through which a transfer robot 430 moves. The carrier table 300 and the substrate processing unit 500 are arranged on both sides of the passage 410, respectively. As illustrated in FIGS. 2 and 3, the substrate transfer unit 400 and the carrier table 300 and the substrate processing unit 500 arranged on both sides of the substrate transfer unit 400 may be arranged in a multi-layer structure including an upper layer and a lower layer. Here, the carrier transfer unit 200 may also have a multi-layer structure to correspond to the carrier table 300 in the multi-layer structure. In addition, fan filter units 260, 460, and 600 configured to supply clean air such that the clean air flows from the top to the bottom may be provided above the carrier transfer unit 200, the carrier table 300, the substrate transfer unit 400, and the substrate processing unit 500, respectively.

The loading/unloading unit 100 may have an in/out port 110 on which the carrier C is placed, and a stocker 120 in which the carrier C that has been transferred for a process or the carrier C to be transferred for a subsequent process is stored may be provided adjacent to the loading/unloading unit 100. The carrier C accommodating the substrate is placed on the in/out port 110 of the loading/unloading unit 100 by a transfer unit (not shown) such as an overhead transfer unit, an overhead conveyor, or an automatic guided vehicle. As the carrier C, an airtight container such as a front-opening unified pod may be used.

The carrier transfer unit 200 is arranged adjacent to the loading/unloading unit 100 and transfers the carrier C placed on the in/out port 110 of the loading/unloading unit 100 to the carrier table 300. The carrier tables 300 are arranged on both sides of the passage 410 to face each other with respect to the passage 410 of the substrate transfer unit 400, and the carriers C delivered from the carrier transfer unit 200 are placed thereon. In addition, the carrier table 300 has an opener 310 for opening the door of the carrier C.

The substrate transfer unit 400 transfers a substrate to be cleaned, from the carrier C placed on the carrier table 300 to the substrate processing unit 500, or transfers a substrate that has been cleaned in the substrate processing unit 500, to the carrier C placed on the carrier table 300. The substrate transfer unit 400 has a passage 410 formed in a direction perpendicular to the center of the carrier transfer unit 200. A transfer guide 420 is installed inside the passage 410 along the lengthwise direction of the passage 410, and the transfer robot 430 loading or unloading the substrate into or from substrate processing unit 500 is guided by the transfer guide 420 to move along the lengthwise direction of the passage 410. In addition, the transfer robot 430 may be guided by a vertical guide (not shown) to move vertically to correspond to the substrate processing unit 500 arranged in a multi-layer structure.

The substrate processing unit 500 has a plurality of cleaning chambers 500a, 500b, 500c, and 500d arranged in parallel on both sides of the passage 410 of the substrate transfer unit 400. For example, as illustrated in FIG. 1, the cleaning chambers 500a, 500b, 500c, and 500d may be arranged such that a total of four cleaning chambers including two cleaning chamber on each side of the passage 410 of the substrate transfer unit 400 constitute one layer. In addition, as illustrated in FIG. 3, cleaning chambers 500e and 500f arranged in the same structure may be arranged in a multi-layer structure to constitute another layer.

Figure 4:
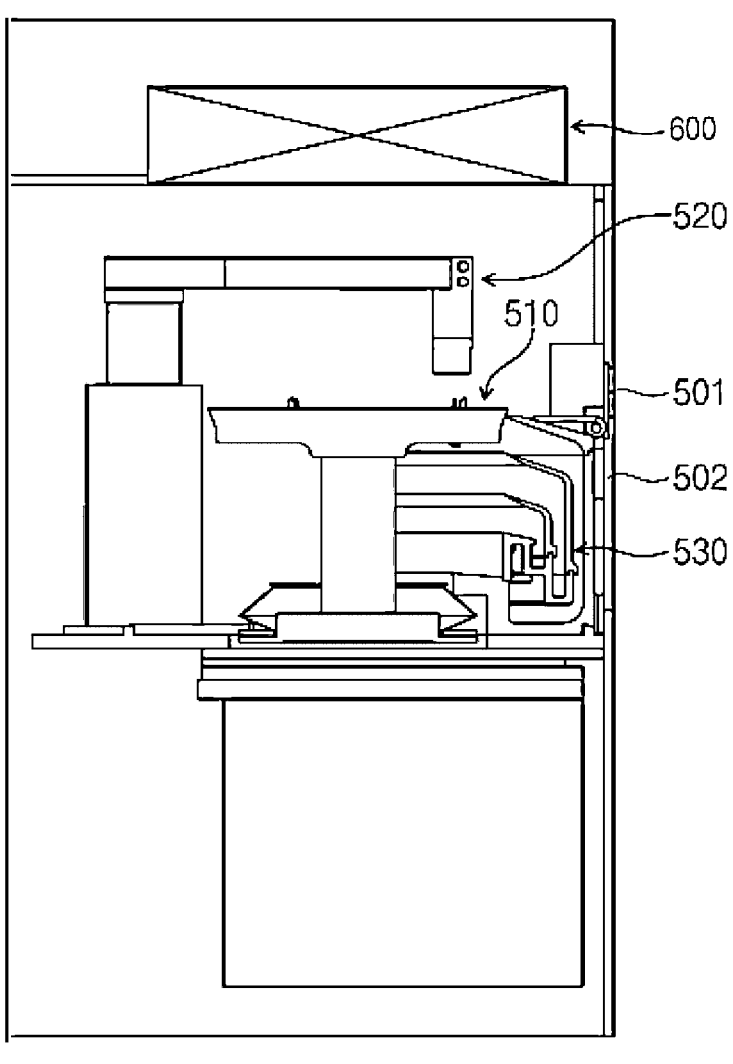
FIG. 4 is an enlarged view of a substrate processing apparatus according to an embodiment among cleaning chambers of FIG. 3.

FIG. 4 is an enlarged view of a substrate processing apparatus according to an embodiment among the cleaning chambers of FIG. 3.

Referring to FIG. 4, the cleaning chamber 500c includes a rotatable support member 510 on which a substrate is placed, a chemical liquid supply member 520 configured to supply a cleaning solution to the substrate placed on the support member 510, and a chemical liquid collecting member 530 arranged around the support member 510. The cleaning liquid is supplied from the chemical liquid supply member 520 to the rotating substrate, the substrate is cleaned by the cleaning liquid, and the cleaning liquid used for cleaning the substrate is collected by the chemical liquid collecting member 530.

During the process in the cleaning chamber 500c, the fan filter unit 600 installed on the top of the cleaning chamber 500c causes clean air to flow from the top to the bottom while forming a downward air flow, and the clean air is exhausted through an exhaust member (not shown).

Figure 5:
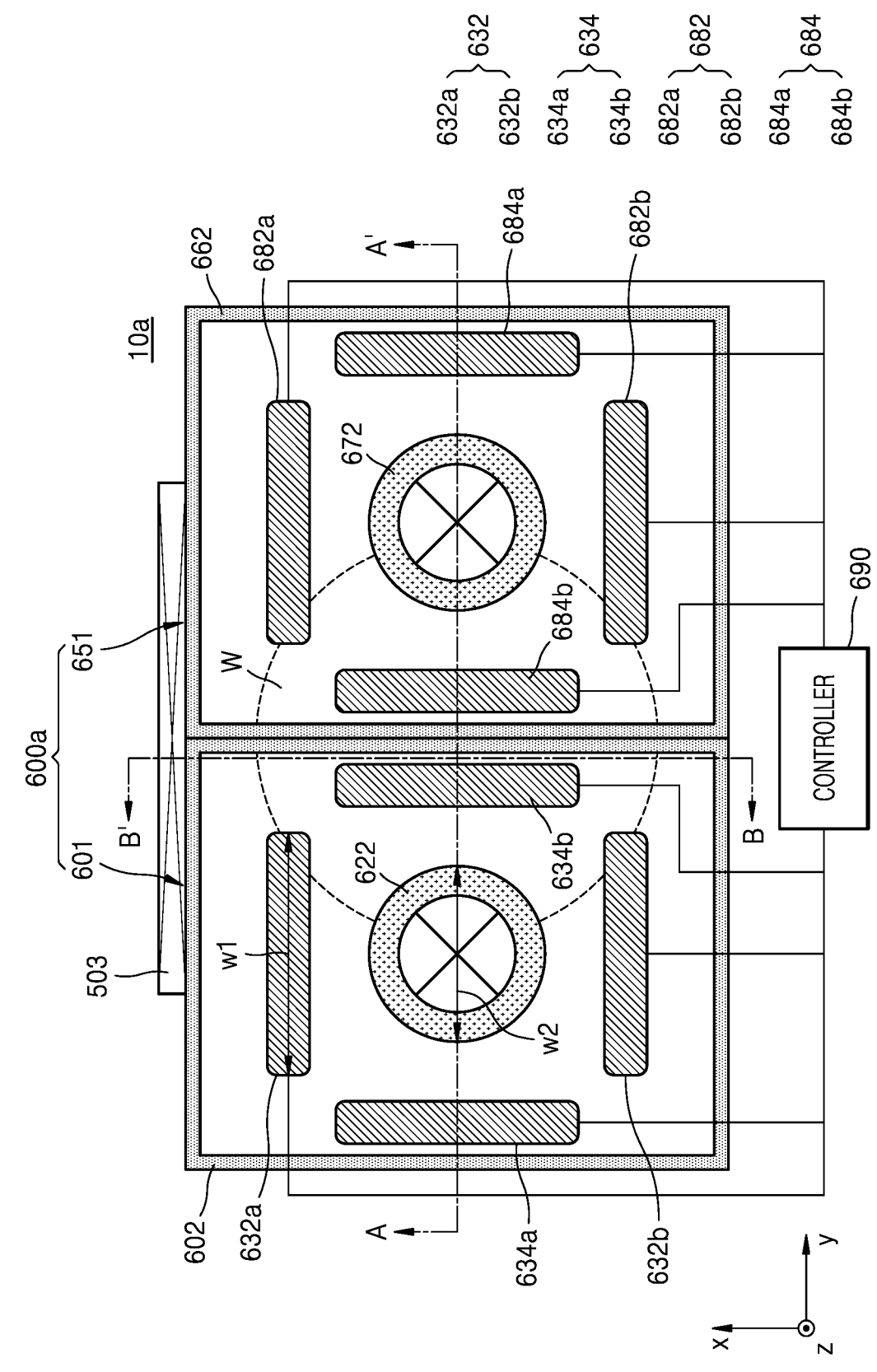
FIG. 5 is a plan view of a substrate processing apparatus according to an embodiment.
Figure 6:
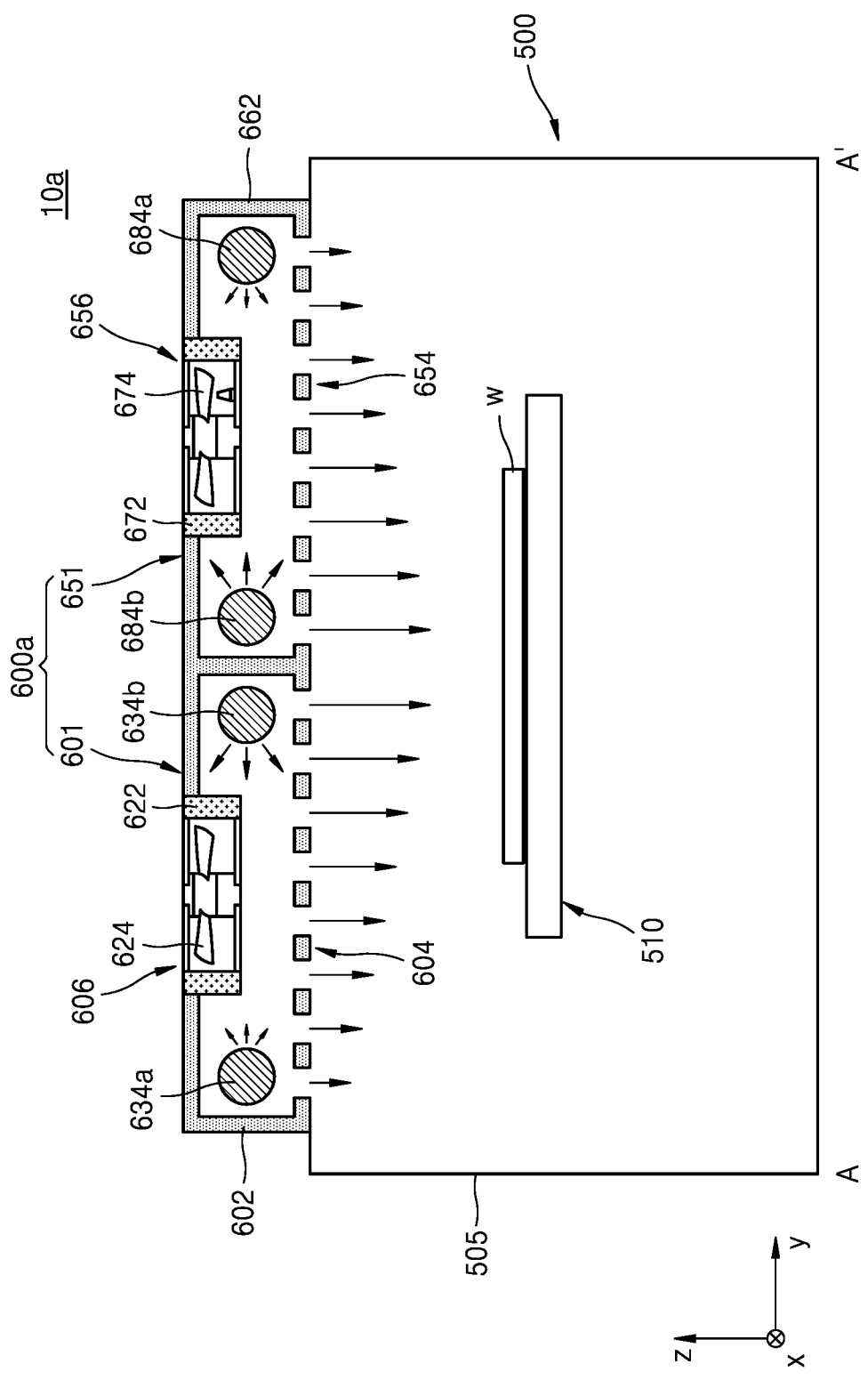
FIG. 6 is a cross-sectional view of the substrate processing apparatus of FIG. 5 taken along line A-A'.

FIG. 5 is a plan view of a substrate processing apparatus according to an embodiment, and FIG. 6 is a cross-sectional view of the substrate processing apparatus of FIG. 5 taken along line A-A'. In addition, FIG. 7 is a cross-sectional view of the substrate processing apparatus of FIG. 5 taken along line BB'.

Figure 7:
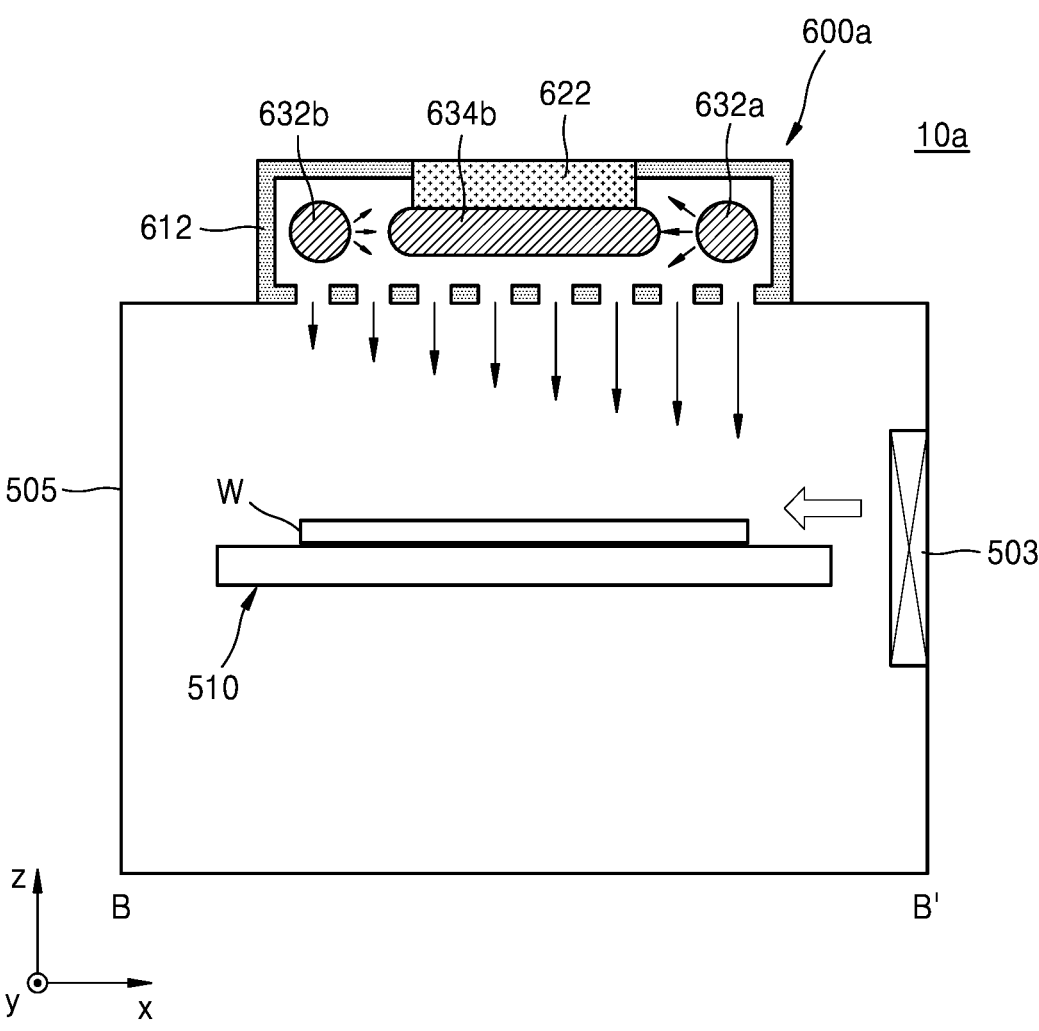
FIG. 7 is a cross-sectional view of the substrate processing apparatus of FIG. 5 taken along line BB'.

Referring to FIGS. 5, 6, and 7, a substrate processing apparatus 10a according to an embodiment may include the substrate processing unit 500 including the support member 510 configured to support a substrate W, an entrance 503 on one side configured to allow the substrate W to enter and exit, and a housing 505 configured to accommodate the substrate W.

According to an embodiment, the substrate processing apparatus 10a may include a first blowing member 601 configured to supply air by forming a downward air flow toward the substrate processing unit 500. The substrate processing apparatus 10a may further include a second blowing member 651 arranged in contact with the first blowing member 601 in a second horizontal direction (y direction) perpendicular to a first horizontal direction (x direction). Like the first blowing member 601, the second blowing member 651 may be configured to supply air by forming a downward air flow toward the substrate processing unit 500. The configuration of the second blowing member 651 may be substantially the same as that of the first blowing member 601.

A fan filter unit 600a may include fan structures 606 and 656 configured to introduce air from the outside. Here, the fan structures 606 and 656 may include fan housings 622 and 672 with open tops and bottoms, respectively. The fan structures 606 and 656 may also include fans 624 and 674 arranged inside the fan housings 622 and 672 and configured to flow air from the open tops to the bottoms of the fan housings 622 and 672, respectively.

According to an embodiment, the fan filter unit 600a may include a pair of first heaters 632 and 682 arranged to be spaced apart from each other in the first horizontal direction (x direction) with the fans 624 and 674 therebetween and configured to supply heat. In addition, the fan filter unit 600a may include a pair of second heaters 634 and 684 arranged to be spaced apart from each other in the second horizontal direction (y direction) perpendicular to the first horizontal direction (x direction) with the fans 624 and 674 therebetween and configured to supply heat. Here, the substrate processing apparatus 10a may further include a controller 690 configured to control heat supply by the first heaters 632 and 682 and the second heaters 634 and 684.

The pair of first heaters 632 and 682 may include front heaters 632a and 682a arranged close to the entrance 503 of the substrate processing unit 500, and rear heaters 632b and 682b facing the front heaters 632a and 682a with the fans 624 and 674 therebetween, respectively.

The pair of second heaters 634 and 684 may include outer heaters 634a and 684a arranged close to the housing 505 of the substrate processing unit 500; and inner heaters 634b and 684b facing the outer heaters 634a and 684a with the fans 624 and 674 therebetween, respectively. The inner heaters 634b and 684b may vertically overlap portions of the substrate W accommodated in the substrate processing unit 500. Also, the fans 624 and 674 may vertically overlap portions of the substrate W accommodated in the substrate processing unit 500.

Each of the pair of first heaters 632 and 682 may have a first width w1 in the second horizontal direction (y direction), and the fan housings 622 and 672 may have a second width w2 that is less than the first width w1, in the second horizontal direction (y direction).

As illustrated in FIG. 6, in a case in which the substrate W is supported by the support member 510, the controller 690 may control the heat supplied by the inner heaters 634b and 684b to be in a greater amount than the heat supplied by the outer heaters 634a and 684a. Accordingly, low-humidity clean air may be supplied to the substrate W even when relatively low power is supplied to the outer heaters 634a and 684a, and thus, efficient substrate processing may be performed. The lengths of the arrows from the fan filter unit 600a are proportional to the temperature of the clean air. As the temperature of the air increases, the humidity of the air may decrease.

As illustrated in FIG. 7, in a case in which the entrance 503 of the substrate processing unit 500 is opened, the controller 690 may control the heat supplied by the front heaters 632a and 682a to be in a greater amount than the heat supplied by the rear heaters 632b and 682b. Accordingly, low-humidity clean air may be supplied to the substrate W even when relatively low power is supplied to the rear heaters 632b and 682b, and thus, efficient substrate processing may be performed. The lengths of the arrows from the fan filter unit 600a are proportional to the temperature of the clean air. As the temperature of the air increases, the humidity of the air may decrease.

Figure 8:
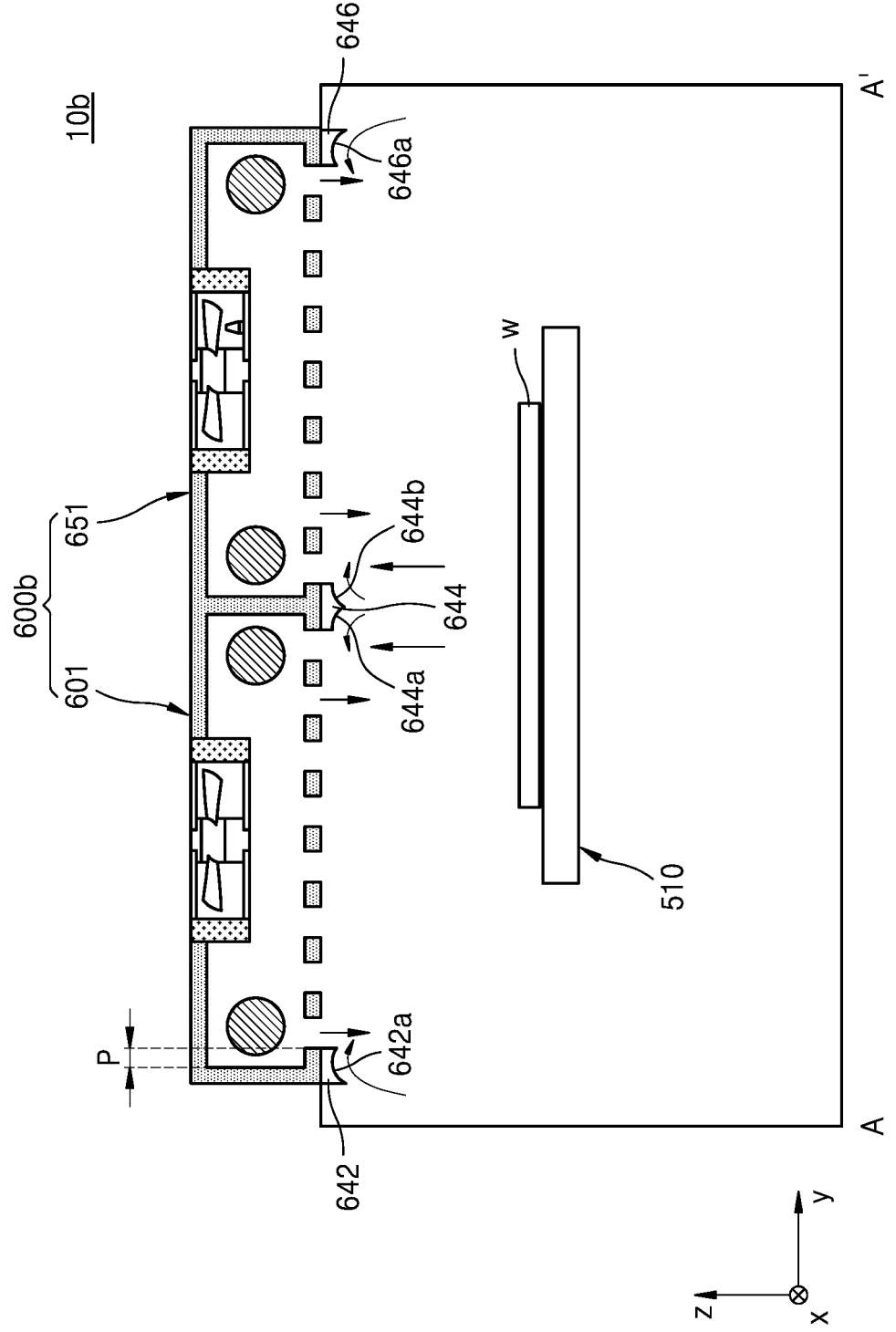
FIG. 8 is a cross-sectional view of a substrate processing apparatus according to another embodiment.

FIG. 8 is a cross-sectional view of a substrate processing apparatus according to another embodiment.

A substrate processing apparatus 10b illustrated in FIG. 8 is substantially the same as or similar to the substrate processing apparatus 10a illustrated in FIGS. 5 to 7, except that a fan filter unit 600b further includes blocking members 642, 644, and 646. Thus, the descriptions of the components described above with reference to FIGS. 5 to 7 will be omitted below.

The fan filter unit 600b of the substrate processing apparatus 10b may further include the blocking members 642, 644, and 646 configured to block a flow of air flowing backward to the fan filter unit 600b. Here, the blocking members 642, 644, and 646 may block a flow of air flowing backward into a clearance space between the fan housings 622 and 672 and the fans 624 and 674. The blocking members 642, 644, and 646 may be provided as annular plates corresponding to clearance spaces P between the fan housings 622 and 672 and the fans 624 and 674, respectively.

Figure 9:
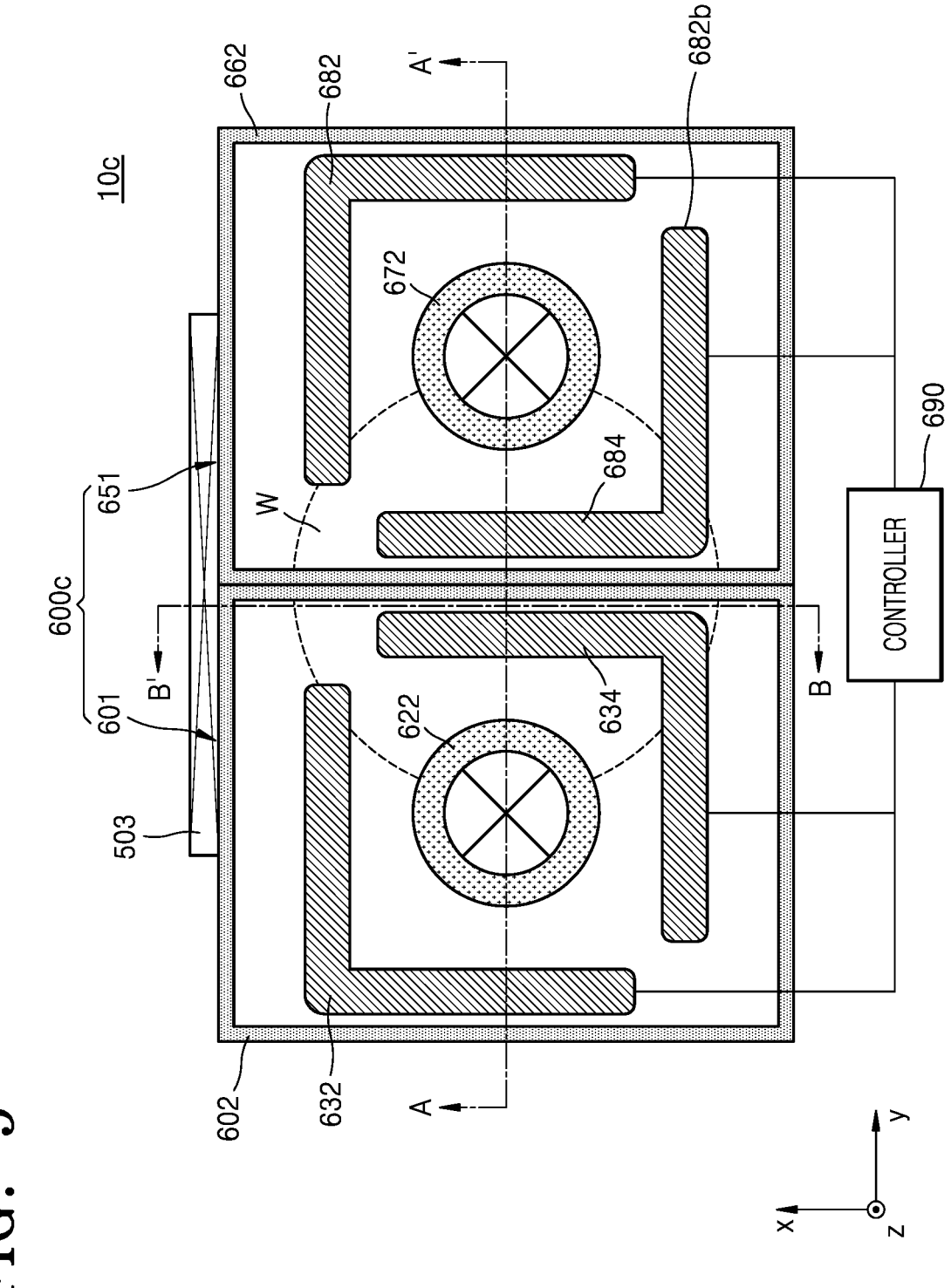
FIG. 9 is a plan view of a substrate processing apparatus according to another embodiment.
Figure 10:
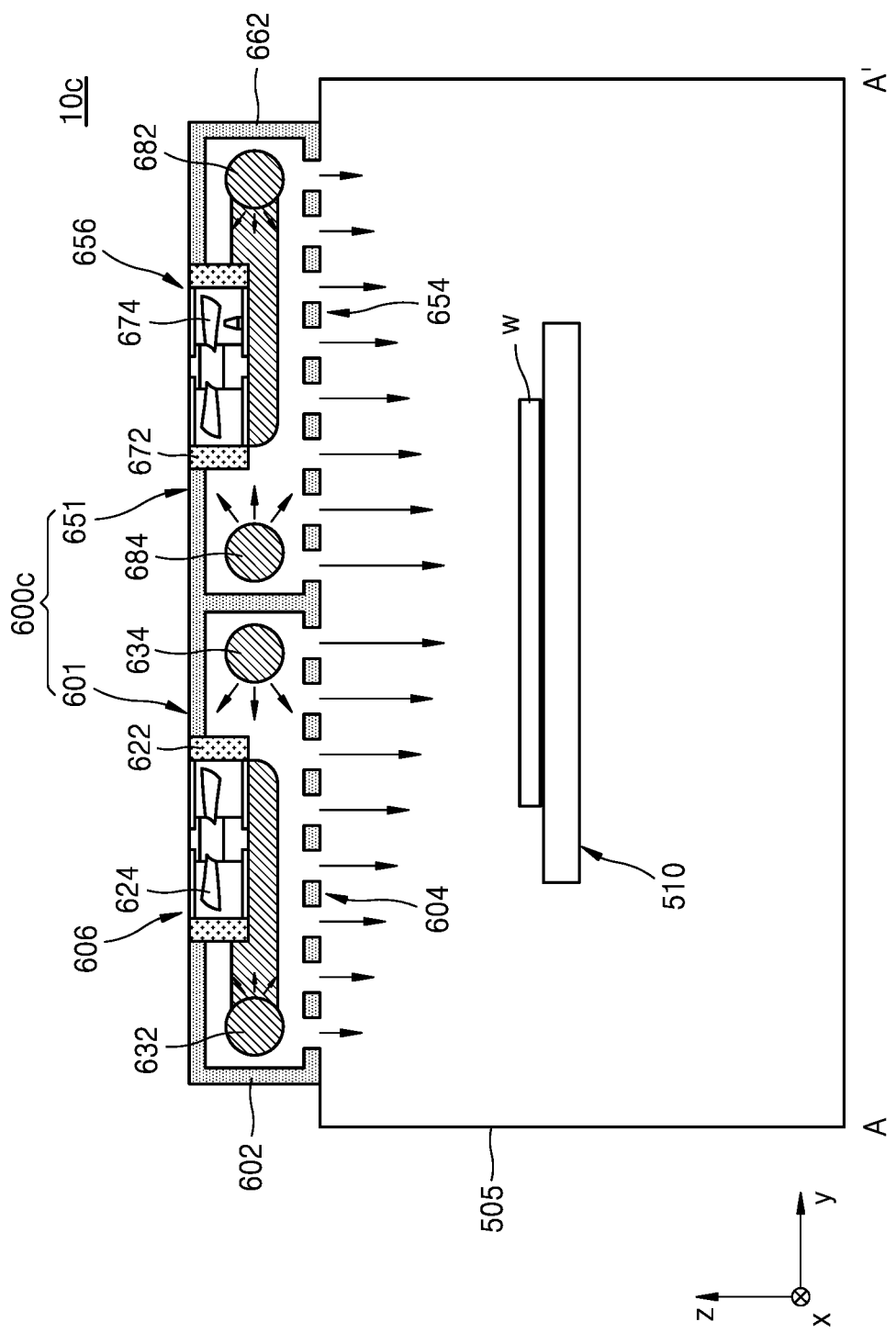
FIG. 10 is a cross-sectional view of the substrate processing apparatus of FIG. 9 taken along line A-A'.

FIG. 9 is a plan view of a substrate processing apparatus according to another embodiment, and FIG. 10 is a cross-sectional view of the substrate processing apparatus of FIG. 9 taken along line A-A'. In addition, FIG. 11 is a cross-sectional view of the substrate processing apparatus of FIG. 9 taken along line BB'.

Figure 11:
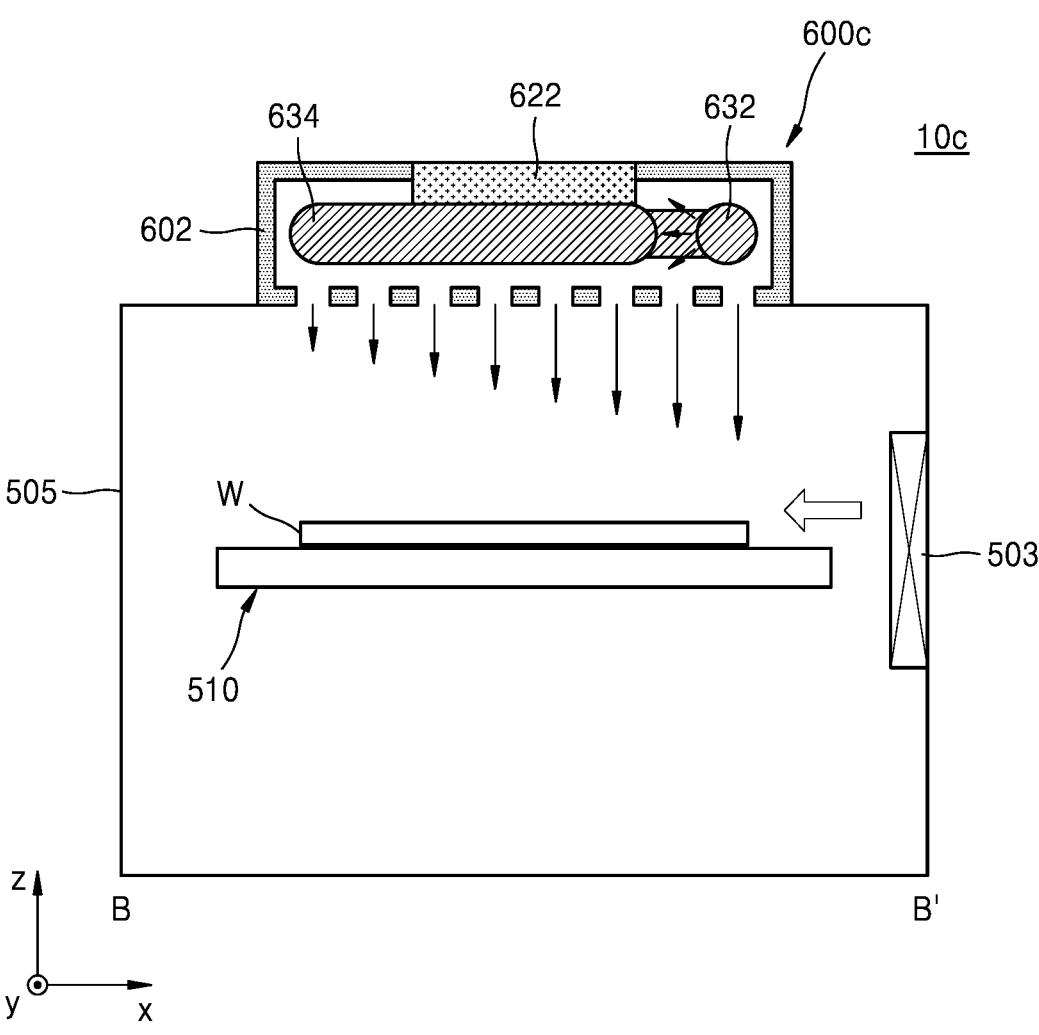
FIG. 11 is a cross-sectional view of the substrate processing apparatus of FIG. 9 taken along line BB'.

The substrate processing apparatus 10b illustrated in FIGS. 9 to 11 is substantially the same as or similar to the substrate processing apparatus 10a illustrated in FIGS. 5 to 7, except that the shapes of the plurality of heaters 632, 634, 682, and 684 are different from those of the substrate processing apparatus 10a. Thus, the descriptions of the components described above with reference to FIGS. 5 to 7 will be omitted below.

Referring to FIGS. 9, 10, and 11, the plurality of heaters 632, 634, 682, and 684 may have an L shape. The first heaters 632 and 682 are arranged close to the entrance 503 and the housing 505 of the substrate processing unit 500, and the second heaters 634 and 684 may be arranged to vertically overlap portions of the substrate W accommodated in the substrate processing unit 500.

As illustrated in FIG. 10, in a case in which the substrate W is supported by the support member 510, the control unit 690 may control the heat supplied by the second heaters 634 and 684 to be in a greater amount than the heat supplied by the first heaters 632 and 682. Accordingly, low-humidity clean air may be supplied to the substrate W even when relatively low power is supplied to the first heaters 632 and 682, and thus, efficient substrate processing may be performed. The lengths of the arrows from a fan filter unit 600c are proportional to the temperature of the clean air. As the temperature of the air increases, the humidity of the air may decrease.

As illustrated in FIG. 11, in a case in which the entrance 503 of the substrate processing unit 500 is opened, the controller 690 may control the heat supplied by the first heaters 632 and 682 to be in a greater amount than the heat supplied by the second heaters 634 and 684. Accordingly, low-humidity clean air may be supplied to the substrate W even when relatively low power is supplied to the second heaters 634 and 684, and thus, efficient substrate processing may be performed. The lengths of the arrows from a fan filter unit 600c are proportional to the temperature of the clean air. As the temperature of the air increases, the humidity of the air may decrease.

Figure 12:
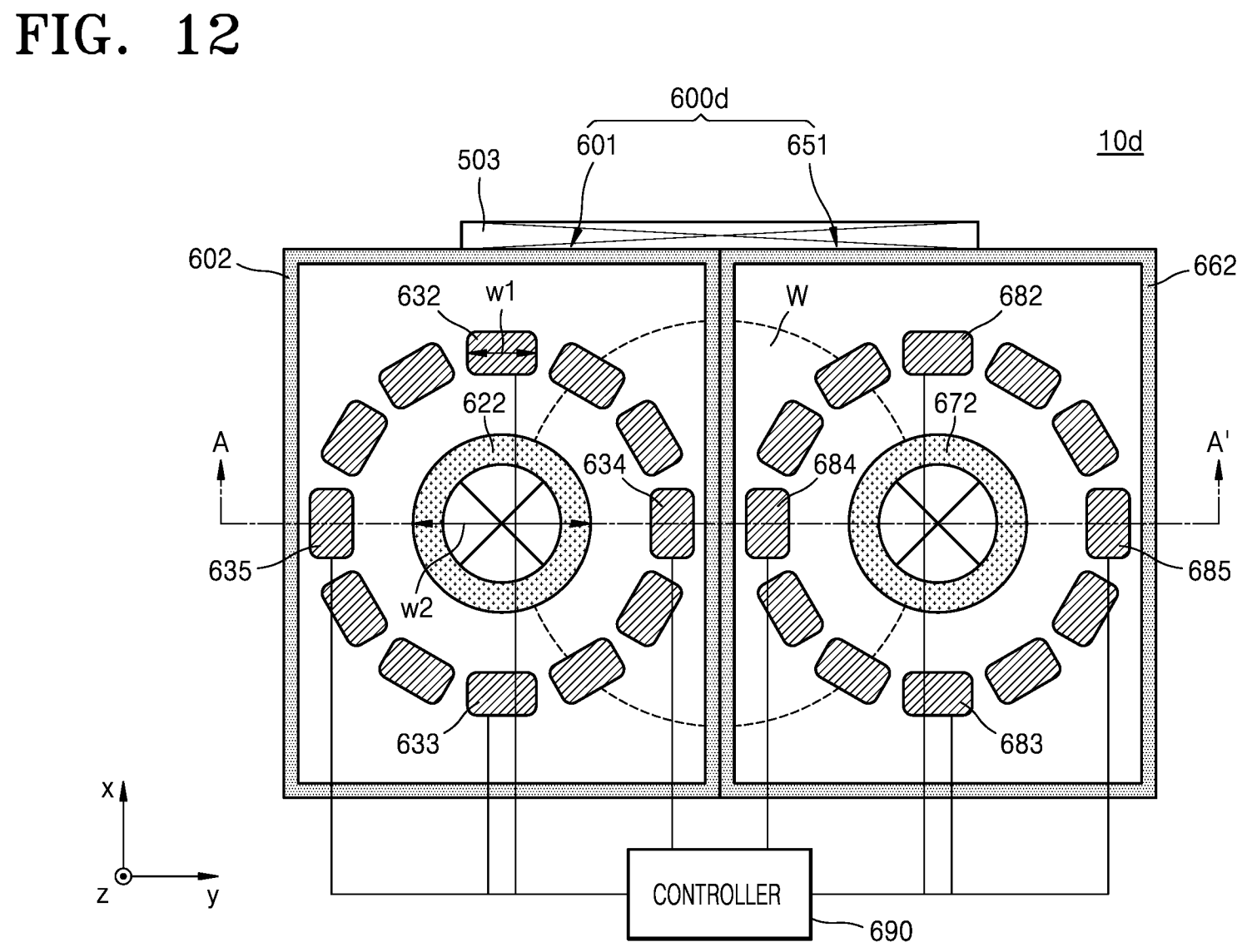
Figure 13:
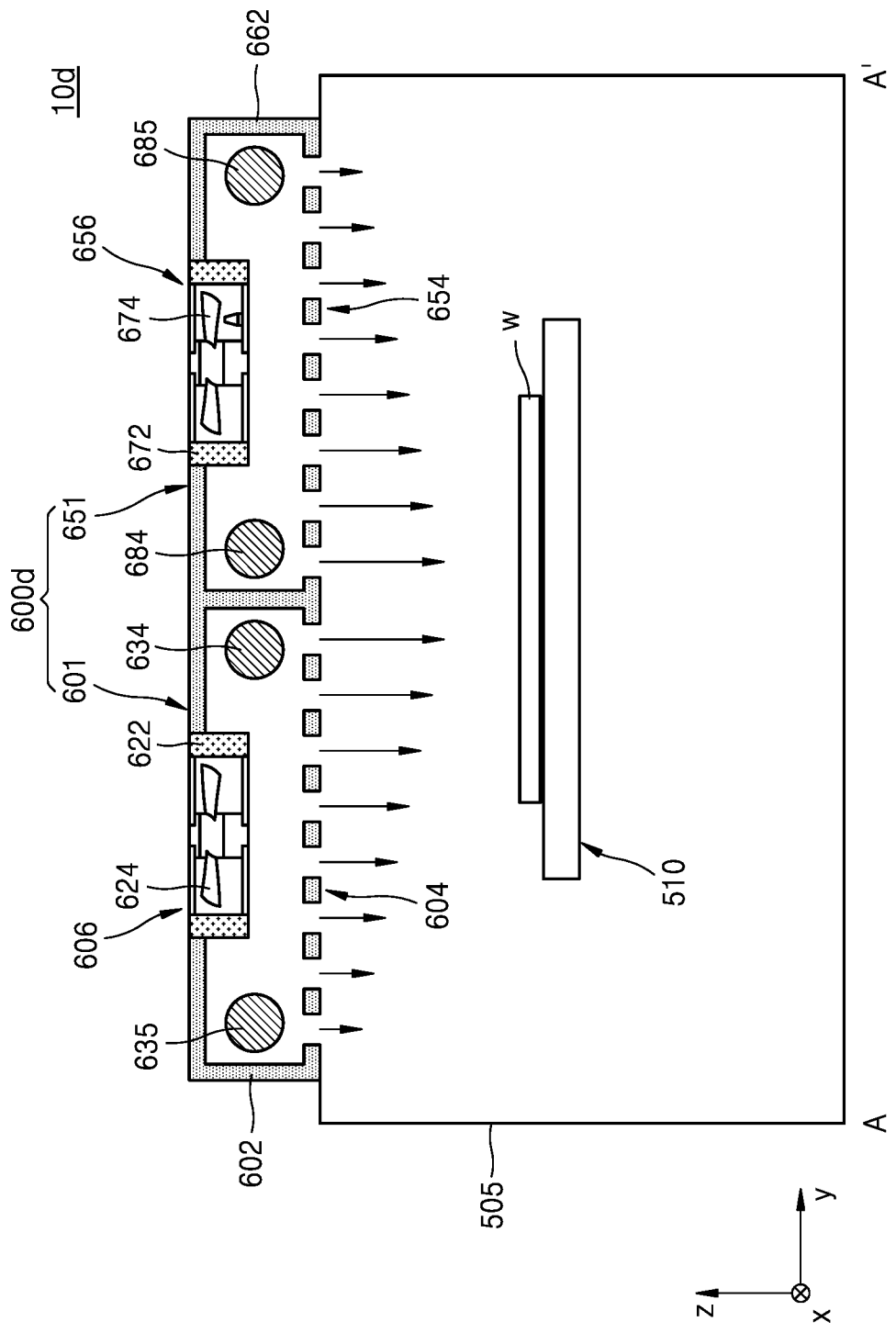
FIG. 13 is a cross-sectional view of the substrate processing apparatus of FIG. 12 taken along line A-A'.

FIG. 12 is a plan view of a substrate processing apparatus according to another embodiment, and FIG. 13 is a cross-sectional view of the substrate processing apparatus of FIG. 12 taken along line A-A'.

A substrate processing apparatus 10d illustrated in FIGS. 12 and 13 is substantially the same as or similar to the substrate processing apparatus 10a illustrated in FIGS. 5 to 7, except that the shapes and arrangement of the plurality of heaters 632, 633, 634, 635, 682, 683, 684, and 685 are different from those of the substrate processing apparatus 10a. Thus, the descriptions of the components described above with reference to FIGS. 5 to 7 will be omitted below.

Referring to FIGS. 12 and 13, a fan filter unit 600d may include the plurality of heaters 632, 633, 634, 635, 682, 683, 684, and 685, which are provided inside the fan housings 622 and 672, are arranged to surround the fans 624 and 674 in an annular shape, and are configured to supply heat. Here, the plurality of heaters 632, 633, 634, 635, 682, 683, 684, and 685 may include the outer heaters 635 and 685 arranged closest to the housing 505 of the substrate processing unit 500, and the inner heaters 634 and 684 facing the outer heaters 635 and 685 with the fans 624 and 674 therebetween, respectively. The inner heaters 634 and 684 may vertically overlap the substrate W accommodated in the substrate processing unit 500.

According to an embodiment, the plurality of heaters 632, 633, 634, 635, 682, 683, 684, and 685 may include the front heaters 632 and 682 arranged closest to the entrance 503 of the substrate processing unit 500, and the rear heaters 633 and 683 facing the front heaters 632 and 682 with the fans 624 and 674 therebetween, respectively.

Each of the plurality of heaters 632, 633, 634, 635, 682, 683, 684, and 685 may have a cylindrical shape having a first width w1 in the second horizontal direction (y direction).

In a case in which the substrate W is supported by the support member 510, the controller 690 may control the heat supplied by the inner heaters 634 and 684 to be in a greater amount than the heat supplied by the outer heaters 635 and 685. Accordingly, low-humidity clean air may be supplied to the substrate W even when relatively low power is supplied to the outer heaters 635 and 685, and thus, efficient substrate processing may be performed. The lengths of the arrows from the fan filter unit 600d are proportional to the temperature of the clean air. As the temperature of the air increases, the humidity of the air may decrease.

In addition, in a case in which the entrance 503 of the substrate processing unit 500 is opened, the controller 690 may control the heat supplied by the front heaters 632 and 682 to be in a greater amount than the heat supplied by the rear heaters 633 and 683. Accordingly, low-humidity clean air may be supplied to the substrate W even when relatively low power is supplied to the rear heaters 633 and 683, and thus, efficient substrate processing may be performed. The lengths of the arrows from the fan filter unit 600d are proportional to the temperature of the clean air. As the temperature of the air increases, the humidity of the air may decrease.

FIG. 14 is a flowchart illustrating a method of controlling a substrate processing apparatus according to an embodiment.

Descriptions will be provided with reference to FIGS. 5 to 8 together with FIG. 14. According to operation S110, in the method of controlling the substrate processing apparatus, the substrate W may be input into the substrate processing unit 500 by opening the entrance 503 of the substrate processing unit 500. Thereafter, according to operation S120, heat supplied by the front heaters 632a and 682a arranged close to the entrance 503 may be controlled to be in a greater amount than heat supplied by the rear heaters 632b and 682b arranged farther from the entrance 503 than the front heaters 632a and 682a. By increasing the heat supplied by the front heaters 632a and 682a, the humidity of the air introduced through the entrance together with the substrate W may be decreased. According to operation S130, the substrate W may be placed on the support member 510 inside the substrate processing unit 500, and then the heat supplied by the front heaters 632a and 682a may be controlled heater to be in the same amount as the heat supplied by the rear heaters 632b and 682b. According to operation S140, heat supplied by the inner heaters 634b and 684b arranged close to the support member 510 may be controlled to be in a greater amount than heat supplied by the outer heaters 634a and 684a arranged farther from the support member 510 than the inner heaters 634b and 684b. By increasing the heat supplied by the inner heaters 634a and 684b, the humidity of air around the substrate W may be decreased while the substrate W is treated on the support member 510. According to operation S150, the substrate W may be separated from the support member 510, and then the heat supplied by the inner heaters 634b and 684b may be controlled heater to be in the same amount as the heat supplied by the outer heaters 634a and 684a.

Embodiments have been described herein and illustrated in the drawings. Although the embodiments have been described herein by using specific terms, they are used only for the purpose of explaining the technical spirit of the disclosure and not used to limit the meaning or scope of the claims. Therefore, those of skill in the art will understand that various modifications and other equivalent embodiments may be derived from the embodiments described herein. Therefore, the true technical protection scope of the disclosure should be determined by the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a substrate processing unit comprising a support member configured to support a substrate, an entrance on one side of the substrate processing unit and configured to allow the substrate to enter and exit the substrate processing unit, and a housing configured to accommodate the substrate; and
a first blowing member configured to supply air by forming a downward air flow toward the substrate processing unit,
wherein the first blowing member comprises:
a fan housing with an open top and an open bottom;
a fan arranged inside the fan housing and configured to flow air from the open top to the open bottom of the fan housing;
a pair of first heaters arranged spaced apart from each other in a first horizontal direction with the fan therebetween and configured to supply heat; and
a pair of second heaters arranged spaced apart from each other in a second horizontal direction perpendicular to the first horizontal direction with the fan therebetween and configured to supply heat, and
wherein the substrate processing apparatus further comprises a controller configured to control heat supply by the pair of first heaters and the pair of second heaters.

2. The substrate processing apparatus of claim 1,
wherein the pair of first heaters comprise:
an outer heater arranged close to the housing of the substrate processing unit; and
an inner heater facing the outer heater with the fan therebetween, and
wherein the inner heater vertically overlaps a portion of the substrate accommodated in the substrate processing unit.

3. The substrate processing apparatus of claim 2,
wherein the controller is further configured to, in a case in which the substrate is supported by the support member, control heat supplied by the inner heater to be in a greater amount than heat supplied by the outer heater.

4. The substrate processing apparatus of claim 1,
wherein the pair of second heaters comprise:

a front heater arranged close to the entrance of the substrate processing unit; and a rear heater facing the front heater with the fan therebetween.

5. The substrate processing apparatus of claim 4, wherein the controller is further configured to, in a case in which the entrance of the substrate processing unit is opened, control heat supplied by the front heater to be in a greater amount than heat supplied by the rear heater.

6. The substrate processing apparatus of claim 1, wherein each of the pair of first heaters has a first width in the first horizontal direction, and wherein the fan housing has a second width less than the first width in the first horizontal direction.

7. The substrate processing apparatus of claim 1, further comprising a second blowing member arranged in contact with the first blowing member in the first horizontal direction, wherein the second blowing member is configured to supply air by forming a downward air flow toward the substrate processing unit.

8. The substrate processing apparatus of claim 1, wherein the fan vertically overlaps a portion of the substrate accommodated in the substrate processing unit.

9. The substrate processing apparatus of claim 1, wherein the first blowing member further comprises a blocking member configured to block a flow of air flowing backward to the first blowing member, and wherein the blocking member is further configured to block a flow of air flowing backward into a clearance space between the fan housing and the fan.

10. The substrate processing apparatus of claim 9, wherein the blocking member is an annular plate corresponding to the clearance space between the fan housing and the fan.

11. A substrate processing apparatus comprising:

a substrate processing unit comprising a support member configured to support a substrate, an entrance on one side of the substrate processing unit configured to allow the substrate to enter and exit the substrate processing unit, and a housing configured to accommodate the substrate; and a first blowing member configured to supply air by forming a downward air flow toward the substrate processing unit, wherein the first blowing member comprises:

a fan housing with an open top and an open bottom;

a fan arranged inside the fan housing and configured to flow air from the open top to the open bottom of the fan housing; and a plurality of heaters arranged around the fan in an annular shape and configured to supply heat, and wherein the substrate processing apparatus further comprises a controller configured to control heat supply by the plurality of heaters.

12. The substrate processing apparatus of claim 11, wherein the plurality of heaters comprise:

an outer heater arranged closest to the housing of the substrate processing unit; and an inner heater facing an outer heater with the fan therebetween, and wherein the inner heater vertically overlaps the substrate accommodated in the substrate processing unit.

13. The substrate processing apparatus of claim 12, wherein the controller is further configured to, in a case in which the substrate is supported by the support member, control heat supplied by the inner heater to be in a greater amount than heat supplied by the outer heater.

14. The substrate processing apparatus of claim 11, wherein the plurality of heaters comprise:

a front heater arranged closest to the entrance of the substrate processing unit; and a rear heater facing the front heater with the fan therebetween.

15. The substrate processing apparatus of claim 14, wherein the controller is further configured to, in a case in which the entrance of the substrate processing unit is opened, control heat supplied by the front heater to be in a greater amount than heat supplied by the rear heater.

16. The substrate processing apparatus of claim 11, further comprising a second blowing member arranged in contact with the first blowing member in a first horizontal direction, wherein the second blowing member is configured to supply air by forming a downward air flow toward the substrate processing unit.

17. The substrate processing apparatus of claim 11, wherein each of the plurality of heaters has a cylindrical shape having a first width in a second horizontal direction, and wherein the fan housing has a second width greater than the first width in a first horizontal direction perpendicular to the second horizontal direction.

18. The substrate processing apparatus of claim 11, wherein the fan vertically overlaps a portion of the substrate accommodated in the substrate processing unit.

19. A method of controlling a substrate processing apparatus, the method comprising:

placing a substrate into a substrate processing unit by opening an entrance of the substrate processing unit;

controlling heat supplied by a front heater arranged close to the entrance to be in a greater amount than heat supplied by a rear heater arranged farther from the entrance than the front heater;

placing the substrate on a support member inside the substrate processing unit, and then controlling the heat supplied by the front heater to be in a same amount as the heat supplied by the rear heater; and controlling heat supplied by an inner heater arranged close to the support member to be in a greater amount than heat supplied by an outer heater arranged farther from the support member than the inner heater.

20. The method of claim 19, further comprising separating the substrate from the support member and then controlling the heat supplied by the inner heater to be in a same amount as the heat supplied by the outer heater.

* * * * *